(12) United States Patent
Yamamoto et al.

(10) Patent No.: US 6,179,923 B1
(45) Date of Patent: Jan. 30, 2001

(54) DEPOSITION APPARATUS FOR AN ORGANIC THIN-FILM LIGHT-EMITTING ELEMENT

(75) Inventors: Tetsuya Yamamoto; Yotaro Shiraishi; Takao Maeda, all of Kanagawa (JP)

(73) Assignee: Fuji Electric Co., Ltd., Kawasaki (JP)

( * ) Notice: Under 35 U.S.C. 154(b), the term of this patent shall be extended for 0 days.

(21) Appl. No.: 09/136,045

(22) Filed: Aug. 18, 1998

(30) Foreign Application Priority Data

Aug. 22, 1997 (JP) .................................................... 9-225892

(51) Int. Cl.[7] .................................................... C23C 14/00
(52) U.S. Cl. ............................................ 118/719; 118/726
(58) Field of Search ........................................ 118/719, 726

(56) References Cited

U.S. PATENT DOCUMENTS 4,406,252 * 9/1983 Jones ..................................... 118/726
4,620,081 * 10/1986 Zeren ..................................... 118/726
4,868,003 * 9/1989 Temple .................................. 118/726

FOREIGN PATENT DOCUMENTS 60-96755 * 5/1985 (JP) ..................................... 118/726

* cited by examiner

*Primary Examiner*—Richard Bueker
(74) *Attorney, Agent, or Firm*—Kanesaka & Takeuchi

(57) ABSTRACT

A deposition apparatus is used for depositing a layer of an organic thin-film light-emitting element on a substrate. The apparatus is formed of a vacuum chamber for depositing the layer for constituting the organic thin-film light-emitting element on the substrate, a set of parts disposed in the vacuum chamber for depositing the layer on the substrate and including a source for the layer, and a supporting member for supporting the set of parts so that the set of parts is replaceably disposed in the chamber. A dust of a material disposed in the source and evaporated therefrom is adhered to the set of parts, but the set of parts can be replaced easily. Thus, the apparatus can be operated efficiently.

8 Claims, 10 Drawing Sheets

DEPOSITION APPARATUS FOR AN ORGANIC THIN-FILM LIGHT-EMITTING ELEMENT

BACKGROUND OF THE INVENTION AND RELATED ART STATEMENT

The present invention relates to a deposition apparatus or vacuum-deposition apparatus for forming layers of an organic light-emitting element used as a display device.

The electro-luminescent element exhibits high visibility due to characteristics of self-luminosity. The electro-luminescent element exhibits excellent resistance against the mechanical impact, since the electro-luminescent element is made of a complete solid-state material. The electro-luminescent element is used to various display devices by virtue of these merits. The organic thin-film light-emitting element, which is an organic electro-luminescent element, has been attracted much attention, since the organic thin-film light-emitting element facilitates greatly lowering the necessary driving voltage and all the colors may be illuminated by appropriately combining various light-emitting materials.

Especially, after Tang et al. disclosed a laminate-type thin-film light-emitting element which emits light with high-luminance of 1000 cd/m$^2$ at a low applied voltage of 10 V (cf. Applied Phys. Lett., 51,913 (1987)), the developments of practical element structures, various materials and manufacturing techniques have been conducted actively.

FIG. 1 is a cross section showing a layer structure in a typical organic thin-film light-emitting element. Referring now to FIG. 1, the thin-film light-emitting element includes an inorganic anode layer 2 deposited under an optically transparent substrate 1, an organic or inorganic hole injection layer 3 under the anode layer 2, an organic light emitting layer 4 under the hole injection layer 3, an organic or inorganic electron injection layer 5 under the light emitting layer 4, and an inorganic cathode layer 6 under the electron injection layer 5. The thin-film light-emitting element is used in a display device by applying a drive voltage supplied from an external power supply 7 between the anode 2 and the cathode 6 such that light generated from the light emitting layer 4 may be controlled.

It is required for the organic light emitting material to be easily formed in a form of a film, to exhibit a high light-emitting efficiency, and to be stable. It is required for the charge injection material to be easily formed in a form of a film, to be highly efficient in charge transport and charge injection into the light emitting layer, and to be stable. Japanese Unexamined Laid Open Patent Applications (KOKAI) No. H02-311591 and No. S59-194393 disclose the preferable materials.

Although vapor phase growth method and liquid phase growth method are applicable to the deposition of the inorganic layer and the organic layer, the vapor phase growth is used generally in depositing the organic and inorganic layers (hereinafter referred to as "constituent layers") of the organic thin-film light-emitting element. Since the organic materials for forming the organic layers are soluble generally into organic and inorganic solvents, it is difficult to deposit the organic layers by the liquid phase growth method.

FIG. 7 is a cross section of a conventional batch-type vacuum-deposition apparatus for depositing a thin layer. FIG. 8 shows cross sections of a conventional single-wafer-processing-type vacuum-deposition apparatus for depositing a thin layer. FIG. 9 is a cross section of a conventional transfer-type vacuum-deposition apparatus for depositing a thin layer.

The apparatuses of FIGS. 7, 8 and 9 include three sources for depositing a thin film consisting of three layers. In the batch-type vacuum-deposition apparatus of FIG. 7, the constituent layers of an organic light-emitting element are deposited successively in respective film-deposition chambers 10a, 10b and 10c. The chambers 10a, 10b and 10c are connected via vacuum valves 11. Sources 8a, 8b and 8c are located below respective shutters 12 in the respective chambers 10a, 10b and 10c. In the single-wafer-processing-type vacuum-deposition apparatus of FIG. 8, sources 8a, 8b and 8c are disposed in a chamber 10, from which a substrate 9 is taken out after a three-layered film is formed thereon. Although the sources 8a, 8b and 8c are located below respective shutters 12 in a chamber 10 in the transfer-type apparatus of FIG. 9, in the similar manner as in the apparatus of FIG. 8, a plurality of thin layers is deposited continuously in the transfer-type apparatus, since the substrate 9 is located on conveyer means in the apparatus of FIG. 9.

It is difficult for the vacuum deposition apparatuses of FIGS. 7, 8 and 9 to deposit the constituent layers of an organic light-emitting element with high rate of operation due to the following three reasons.

(1) In depositing organic or inorganic layers in a vacuum deposition apparatus, it is necessary to conduct a maintenance operation for cleaning the parts equipped in each chamber and the inside wall of the chambers except the substrate after every deposition on the substrate.

(2) It is necessary to initialize (degas) the sources after a new source of an organic or inorganic material (hereinafter referred to as "constituent material") has been loaded or after the source or sources have been exposed to air by breaking the vacuum condition of the vacuum chamber.

(3) The film deposition should be interrupted when it becomes impossible to keep using the source, e.g. due to exhaustion of the source material.

The foregoing reasons (1) and (2) will be explained below in more detail.

At first, the reason (1) will be explained.

In the step of depositing the constituent material on the substrate in the vacuum deposition apparatus, the constituent material evaporating from its source accumulates in the form such as flakes on the following five constituent parts of the vacuum deposition apparatus except the substrate.

The part 1: a source including a boat or crucible for heating an organic or inorganic material and a constituent material to be evaporated by resistance heating in a vacuum condition.

The part 2: a mask for controlling or limiting the vapor flow of the constituent material into a predetermined pattern to deposit the constituent material in accordance with the predetermined pattern on the substrate.

The part 3: a shutter for allowing the vapor flow of the constituent material to pass or block, used at the start or end of depositing the constituent material on the substrate.

The part 4: a sensor for monitoring the thickness of the deposited constituent material layer and the deposition rate of the layer.

The part 5: a shielding cover for preventing the constituent material from accumulating on the inside wall of the vacuum chamber.

The organic material accumulated on the shielding cover, the mask, the shutter, the sensor and the source tends to peel off inside the apparatus due to the thermal instability, the low density, the insulative nature thereof and the large differences in the coefficient of thermal expansion between the organic material and the inorganic materials such as aluminum and stainless steel, which is used mostly for the above-described parts.

If the parts of the vacuum deposition apparatus once accumulated with the organic material are used in the next step, the organic material which has peeled off the parts will be contained in the organic light-emitting element as the powdery dust.

The size of the powdery dust is in the range between several Å and several mm depending on the manner of the peeling, the material thereof, the vaporization rate of the organic material and the structure of the vacuum chamber. On the other hand, the constituent layer of the organic light-emitting element is very thin and the thickness thereof is in the range between several tens nm and several hundreds nm. Therefore, even if the powdery dust in the layer thickness size is included in the light-emitting element, it causes dark spots due to the coagulation of the organic materials, a leakage current due to localization of the electric field, and chemical change of the organic layer, so that shortening of life of the light-emitting layer, increasing of poor portions in the light-emitting, luminance fluctuation and color fluctuation are caused. Therefore, the inclusion of the powdery dust in the light-emitting element causes serious problems on the development of the organic thin-film light-emitting element.

It is difficult to improve the rate of operation of the vacuum deposition apparatus for forming the thin layer and the costs of manufacturing of the organic thin-film light-emitting element soar, since it is necessary to frequently clean the parts equipped in the vacuum chamber on which the organic material is accumulated.

Now the reason (2) will be explained below.

It is necessary to break the vacuum condition in the vacuum chamber for the cleaning of the parts in the steps of depositing the constituent layers. Once the vacuum condition is broken, gas components, such as hydrogen, water, carbon monoxide and carbon dioxide, are absorbed into the sources. In forming the thin layer, the vacuum chamber is heated up to a certain soaking temperature, kept at the soaking temperature and cooled to degas the source before the deposition. If this degassing operation (maintenance operation) is omitted, the gas constituents, such as hydrogen, water, carbon monoxide and carbon dioxide, are contained in the organic light-emitting element.

The inclusion of the gas constituents causes lowering of the injection efficiencies of the electron and the hole injected from the respective electrodes to the light-emitting layer, and chemical change of the light-emitting layer. Since the lowering of the injection efficiencies and the chemical change further cause lowering of the luminance of the organic thin-film light-emitting element, the inclusion of the gas constituents poses serious problems impeding the practical use of the organic thin-film light-emitting elements.

When a new source is loaded, a uniform constituent layer will not be deposited immediately after heating the new source, if a specific degassing operation (initializing operation) is not conducted.

Thus, it is difficult to improve the rate of operation of the vacuum deposition apparatus for forming the thin layers and to lower the manufacturing cost of the organic thin-film light-emitting element, since it is necessary to conduct the foregoing maintenance operation frequently and since it is necessary to conduct the above described initializing operation including degassing every time when the source is replaced to new one.

One batch process in the conventional vacuum deposition apparatus needs all of the steps of cleaning the constituent parts contaminated with dust, loading the cleaned constituent parts into the vacuum chamber, evacuating the vacuum chamber, initializing the sources, heating the sources, depositing a constituent layer on a substrate, changing the substrates and removing the constituent parts contaminated with dust, as described in FIG. 10.

In view of the foregoing, it is an object of the invention to provide a deposition apparatus for an organic thin-film light-emitting element which obviates the foregoing problems of the conventional apparatuses.

It is another object of the invention to provide a deposition apparatus which facilitates manufacturing of the organic light-emitting element which contains less defects, at a high rate of operation thereof.

SUMMARY OF THE INVENTION

According to an aspect of the invention, there is provided a deposition apparatus for an organic thin-film light-emitting element which emits light by recombination of electrons and holes, the apparatus comprising a vacuum chamber for depositing a thin layer on a substrate, and a set of parts of the apparatus except the substrate, the parts being located in the vacuum chamber where the material of the layer evaporated from its source accumulates. The set of parts is disposed on a supporting member so that the set of parts may be loaded into the chamber in a replaceable manner.

Preferably, the set of parts includes the source of the material of the thin layer, a heater for heating the source, a sensor for monitoring the thickness of the thin layer, a shutter for allowing the vapor flow of the material of the thin layer to pass or to be blocked at the start or end of deposition of the thin layer, a mask for shaping the thin layer with a predetermined pattern, and a shielding cover for preventing the material of the thin layer from accumulating on the inside wall of the vacuum chamber.

Advantageously, the apparatus further includes a load lock chamber connected to a vacuum pump, the load lock chamber being connected to the vacuum chamber via a vacuum valve so that the set of parts may be replaced while the vacuum condition of the vacuum chamber is maintained.

Advantageously, the apparatus further includes a preheating chamber for initializing the source, the preheating chamber including temperature regulating means for regulating the temperature of the source and means for maintaining the vacuum condition of the preheating chamber. The preheating chamber is spaced apart from the vacuum chamber.

Advantageously, the apparatus further includes a vacuum valve for connecting the preheating chamber with the vacuum chamber for facilitating transfer of the source between the preheating chamber and the vacuum chamber while the vacuum condition of the vacuum chamber is maintained.

Advantageously, the apparatus further includes an additional set of parts including another source. The load lock chamber functions also as a preheating chamber for initializing the other source.

According to another aspect of the invention, there is provided a deposition apparatus for an organic thin-film light-emitting element which emits light by recombination of electrons and holes, the apparatus including a vacuum chamber for depositing a thin layer on a substrate; a source of the constituent material of the thin layer; and a preheating chamber for initializing the source. The preheating chamber includes temperature regulating means for regulating the temperature of the source and means for maintaining the vacuum condition of the preheating chamber, the preheating chamber being spaced apart from the vacuum chamber.

Advantageously, the above described apparatus further includes a vacuum valve for connecting the preheating chamber with the vacuum chamber to facilitate transfer of the source between the preheating chamber and the vacuum chamber while the vacuum condition of the vacuum chamber is maintained.

DETAILED DESCRIPTION OF PREFERRED EMBODIMENTS

Now the present invention will be explained hereinafter with reference to the accompanied drawings which illustrate the preferred embodiments of the invention. The preferred embodiments will be described as an apparatus for depositing one organic layer or one inorganic layer and cleaning the constituent parts contaminated with dust after one light-emitting element is formed.

Figure 1:
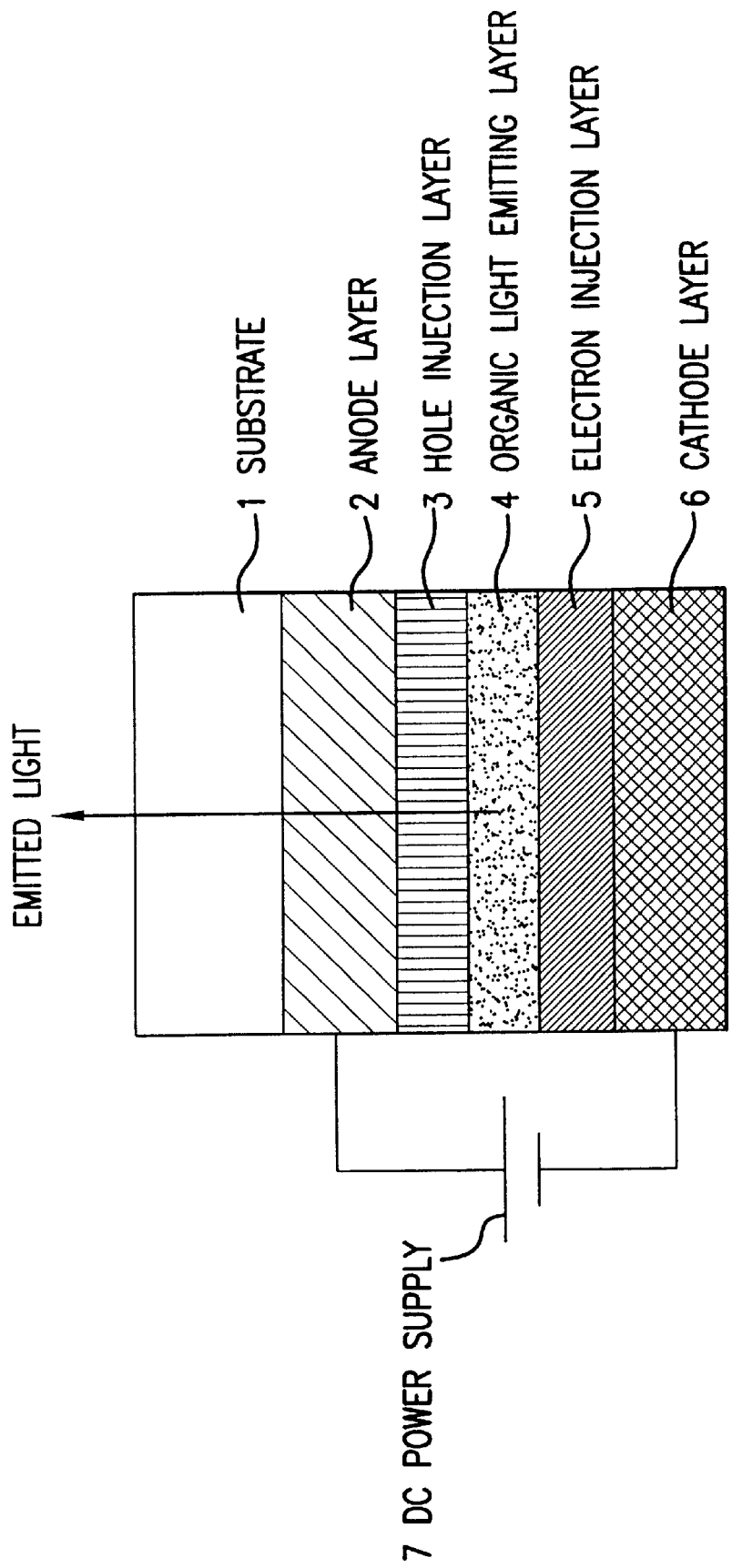
FIG. 1 is a cross sectional view showing a layer structure in a typical organic thin-film light-emitting element.
Figure 2:
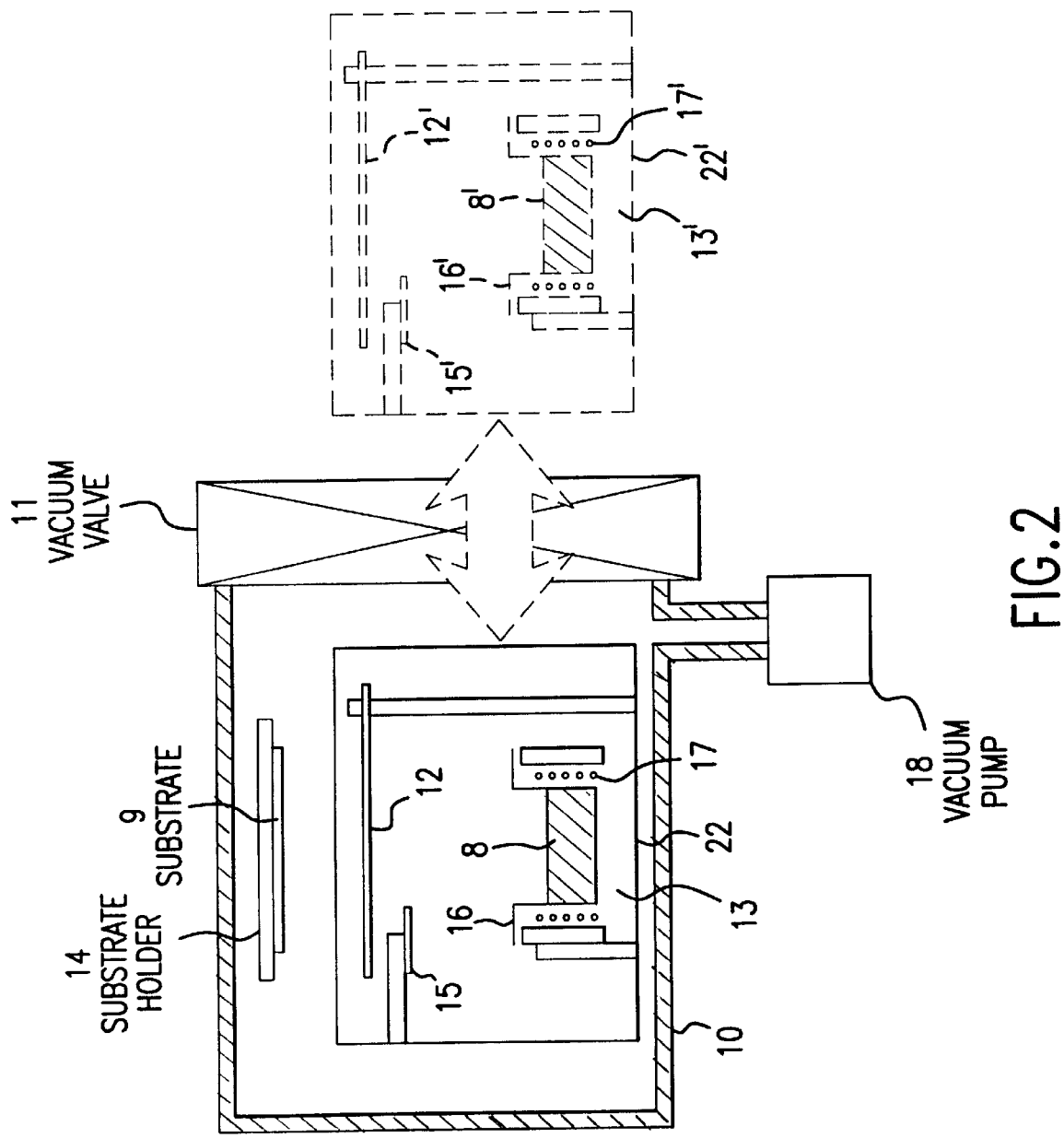
FIG. 2 is a cross sectional view of an apparatus for depositing one organic layer or one inorganic layer of the light-emitting element according to a first embodiment of the invention.

FIG. 2 is a cross sectional view of an apparatus for depositing one organic layer or one inorganic layer of the light-emitting element according to the first embodiment of the invention. In FIG. 2, there is shown a set of parts (hereinafter referred to as a "parts set") 13 consisting of the constituent parts which may be contaminated with dust of organic or inorganic material evaporated from its source. The constituent parts are collectively supported on a supporting member. The constituent parts include a source 8, a crucible 16, a heater 17, a sensor 15, a shutter 12, a mask and a shielding cover. The parts set 13 is assembled in such a configuration that the parts set 13 can be taken out from a chamber 10 via a vacuum valve 11.

A plurality of parts sets is prepared, and another parts set 13' is cleaned and another source 8' is mounted on the cleaned parts set 13' while a predetermined thin layer is deposited on a substrate 9 by using the parts set 13 in a chamber 10. Before depositing another thin layer, the parts set 13 is replaced by the cleaned parts set 13' through the vacuum valve 11 as indicated by the bidirectional arrow in FIG. 2. Thus, the time for cleaning the parts set 13' is not required substantially. That is, the step of cleaning the constituent parts contaminated with dust is substantially omitted from the process of FIG. 10. Therefore, the rate of operation of the apparatus for depositing a thin layer is increased.

Figure 3:
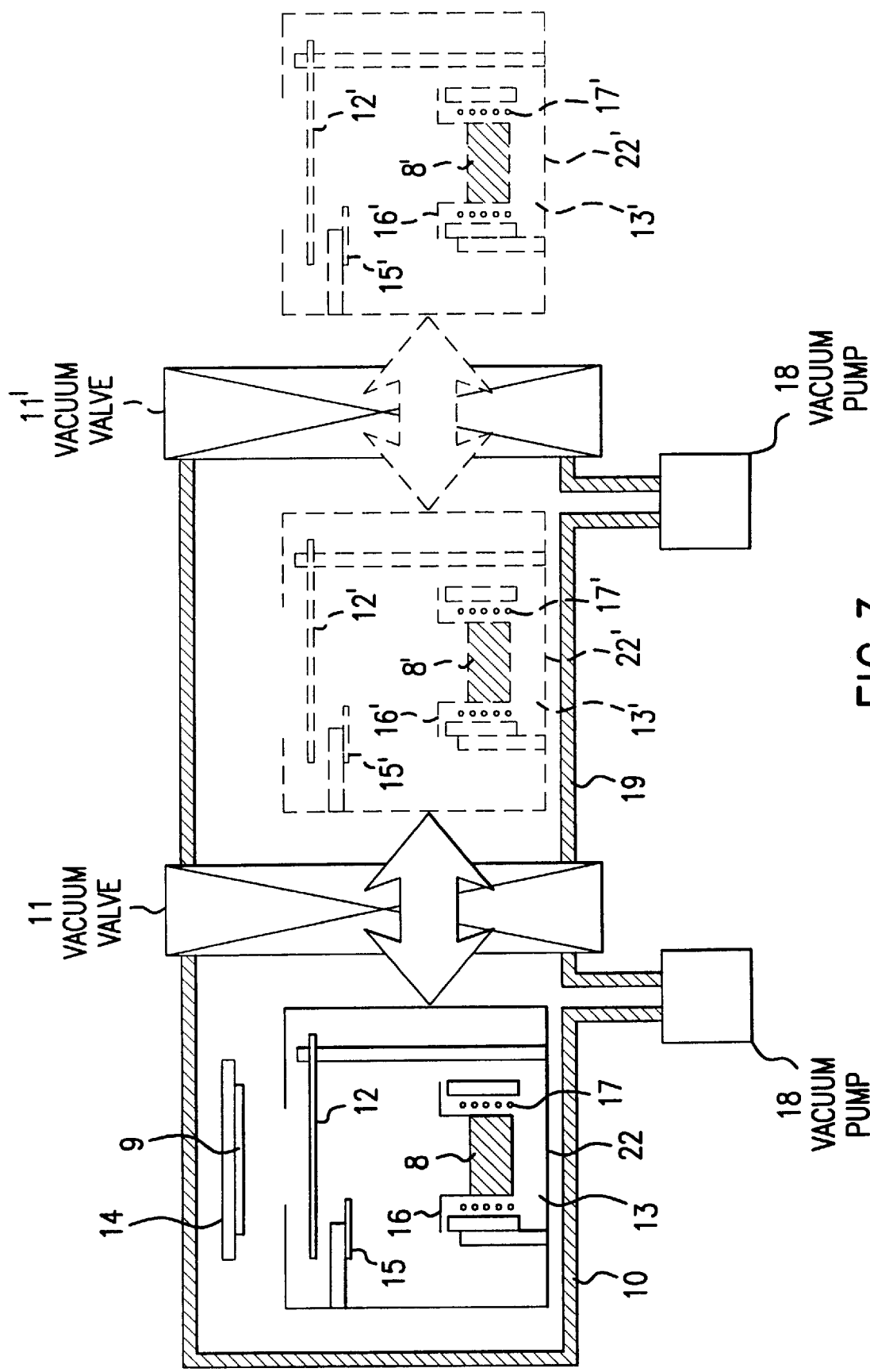
FIG. 3 is a cross sectional view of an apparatus for depositing one organic layer or one inorganic layer of the light-emitting element according to a second embodiment of the invention.

FIG. 3 is a cross sectional view of an apparatus for depositing one organic layer or one inorganic layer of the light-emitting element according to the second embodiment of the invention. In FIG. 3, there is shown a load lock chamber 19 connected to the vacuum chamber of FIG. 2 via a vacuum valve 11 so that the parts sets may be exchanged without breaking the vacuum condition of the chamber in which the layer deposition is conducted. The load lock chamber 19, connected to a vacuum pump 18, is a chamber for replacing the contaminated parts set 13' without breaking the vacuum condition of the chamber 10. The load lock chamber 19 is constructed such that the parts set 13 can be loaded therein.

In this structure, a plurality of parts sets is prepared. Another parts set 13' with another source 8' thereon is cleaned; the cleaned parts set 13' is loaded in the load lock chamber 19 as indicated by the bidirectional arrow described by broken lines in FIG. 3; the vacuum valve 11' is closed; and the load lock chamber 19 is evacuated by the vacuum pump 18, while a predetermined thin layer is deposited on a substrate 9 by using a parts set 13 in a chamber 10. Before depositing another thin layer, the parts set 13 is replaced by the cleaned parts set 13' through the vacuum valve 11 as indicated by the bidirectional arrow described by solid lines in FIG. 3. Thus, the time for cleaning the parts set 13' and the time for evacuating the chamber 10 are not used additionally. That is, the steps of cleaning the constituent parts contaminated with dust and evacuating air in the chamber 10 are substantially omitted from the process of FIG. 10. Therefore, the rate of operation of the apparatus for depositing a thin layer is increased.

Figure 4:
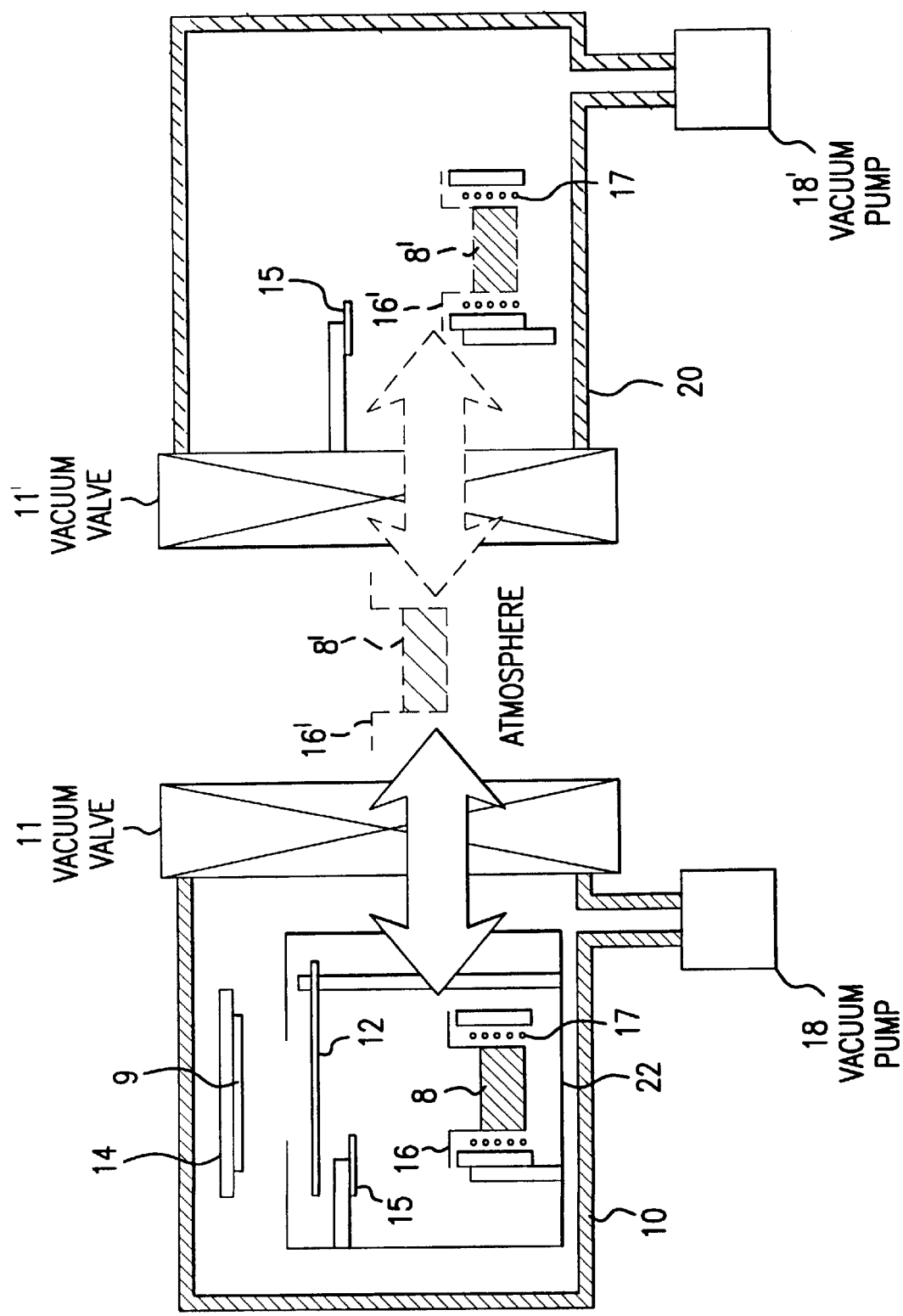
FIG. 4 is a cross sectional view of an apparatus for depositing one organic layer or one inorganic layer of the light-emitting element according to a third embodiment of the invention.

FIG. 4 is a cross sectional view of an apparatus for depositing one organic layer or one inorganic layer of the light-emitting element according to the third embodiment of the invention. The apparatus according to the third embodiment includes a preheating chamber 20 for initializing a source used in depositing a constituent layer. The preheating chamber 20 is provided with a source-temperature regulating function and a vacuum-state maintaining function. The preheating chamber 20 includes a source 8', a sensor 15, a crucible 16', a heater 17 and a vacuum pump 18'. The temperature regulating function is a function for operating the heater 17 for heating the source in the chamber 20. The temperature regulating function includes a function of heating the source to a predetermined soaking temperature, which includes a function of keeping the soaking temperature and a function of cooling. The vacuum-state maintaining function is obtained by the connection of the preheating chamber 20 to the vacuum pump 18'. In FIG. 4, the preheating chamber 20 is spaced apart from the vacuum chamber 10, in which the layer deposition is conducted.

In this structure, while a predetermined thin layer is deposited on a substrate 9 in the vacuum chamber 10, the next source 8' is loaded in the preheating chamber 20; the vacuum valve 11' is closed; the chamber 20 is evacuated; the source 8' is initialized; the vacuum valve 11' is opened; and the initialized source 8' is taken out from the preheating chamber 20 as indicated by the bidirectional arrow described by broken lines in FIG. 4. Before deposition of the next layer, the vacuum valve 11 is opened, the source 8 is taken out from the inside of the shielding cover 22 and the initialized source 8' is loaded in the vacuum chamber 10 as indicated by the bidirectional arrow described by solid lines in FIG. 4. Then, the next layer deposition starts. Thus, the time for initializing the next source 8' is not required additionally. That is, the step of initializing the next source is substantially omitted from the process of FIG. 10. Therefore, the rate of operation of the apparatus for depositing a thin layer is increased.

In the above embodiment, the preheating chamber 20 may be connected to the vacuum chamber 10 through the vacuum valve 11 for transferring the source 8 from the chamber 10 to the chamber 20 or for transferring the source 8' from the chamber 20 to the chamber 10 while maintaining the chamber 10 under the vacuum state. By this combination, the time for initializing the source and the time for evacuating the chamber 10 are not required additionally. That is, the steps of initializing the source and evacuating the chamber 10 are omitted from the process of FIG. 10. Thus, the rate of operation of the apparatus for depositing a thin layer is further improved.

Figure 10:
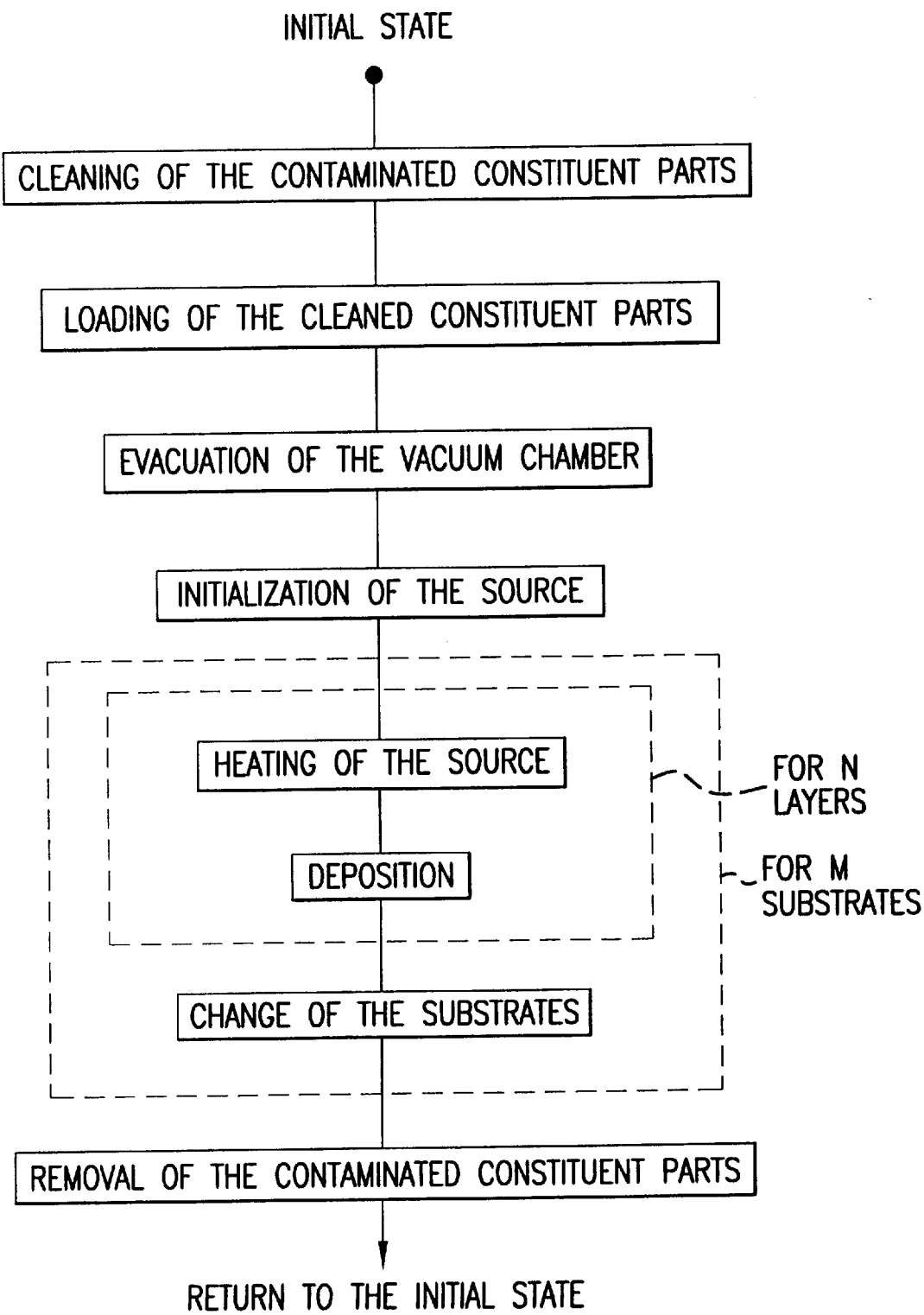
FIG. 10 is a flow chart describing one batch process in the conventional vacuum deposition apparatus.
Figure 6:
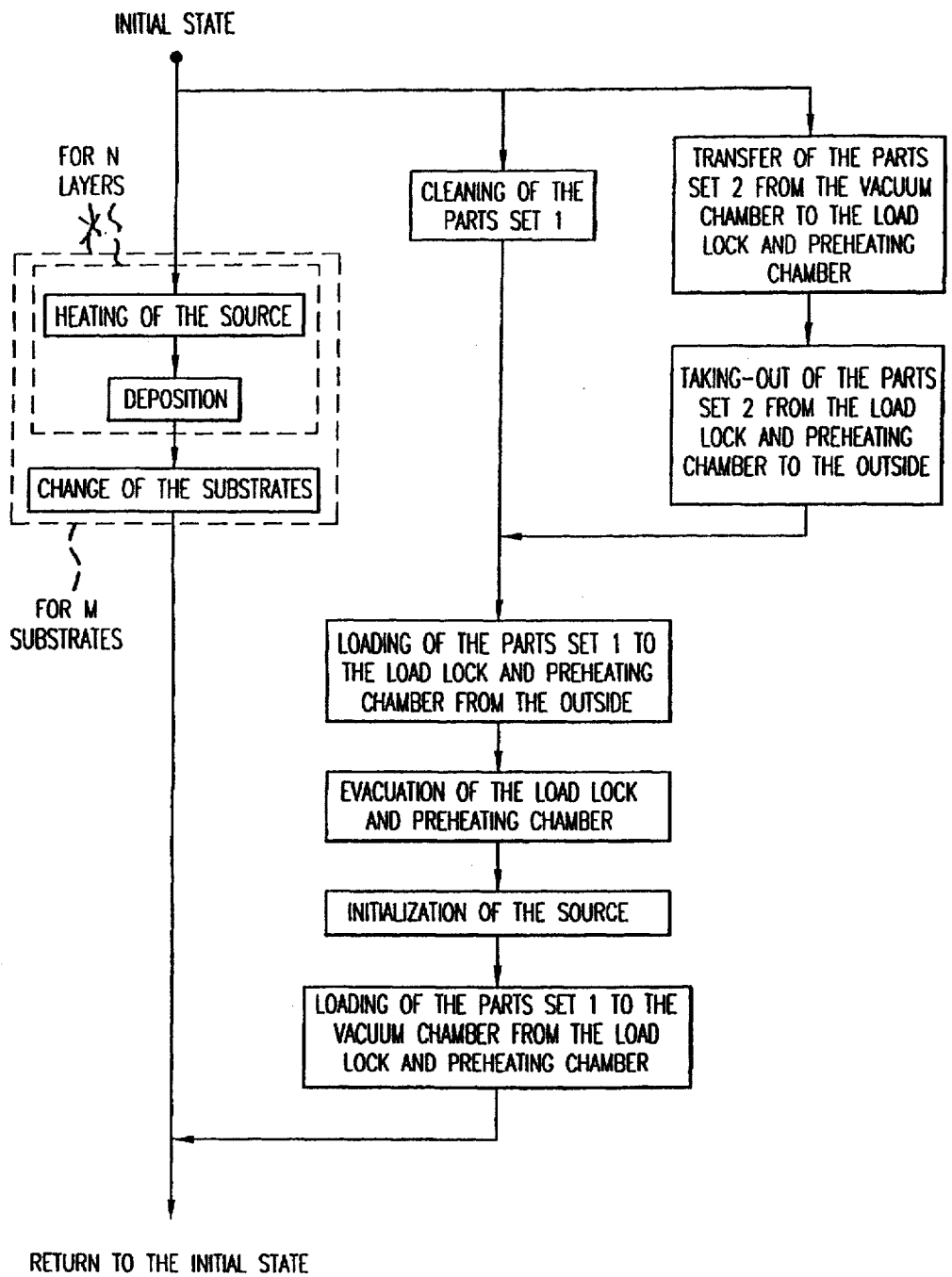

By using the apparatus including the load lock chamber 19 of FIG. 3 and the preheating chamber 20 of FIG. 4, the steps of cleaning the contaminated parts set, initializing the source and evacuating the chamber 10 are omitted from the process of FIG. 10, substantially. Thus, the rate of operation of the apparatus for depositing a thin layer is further improved.

Figure 5:
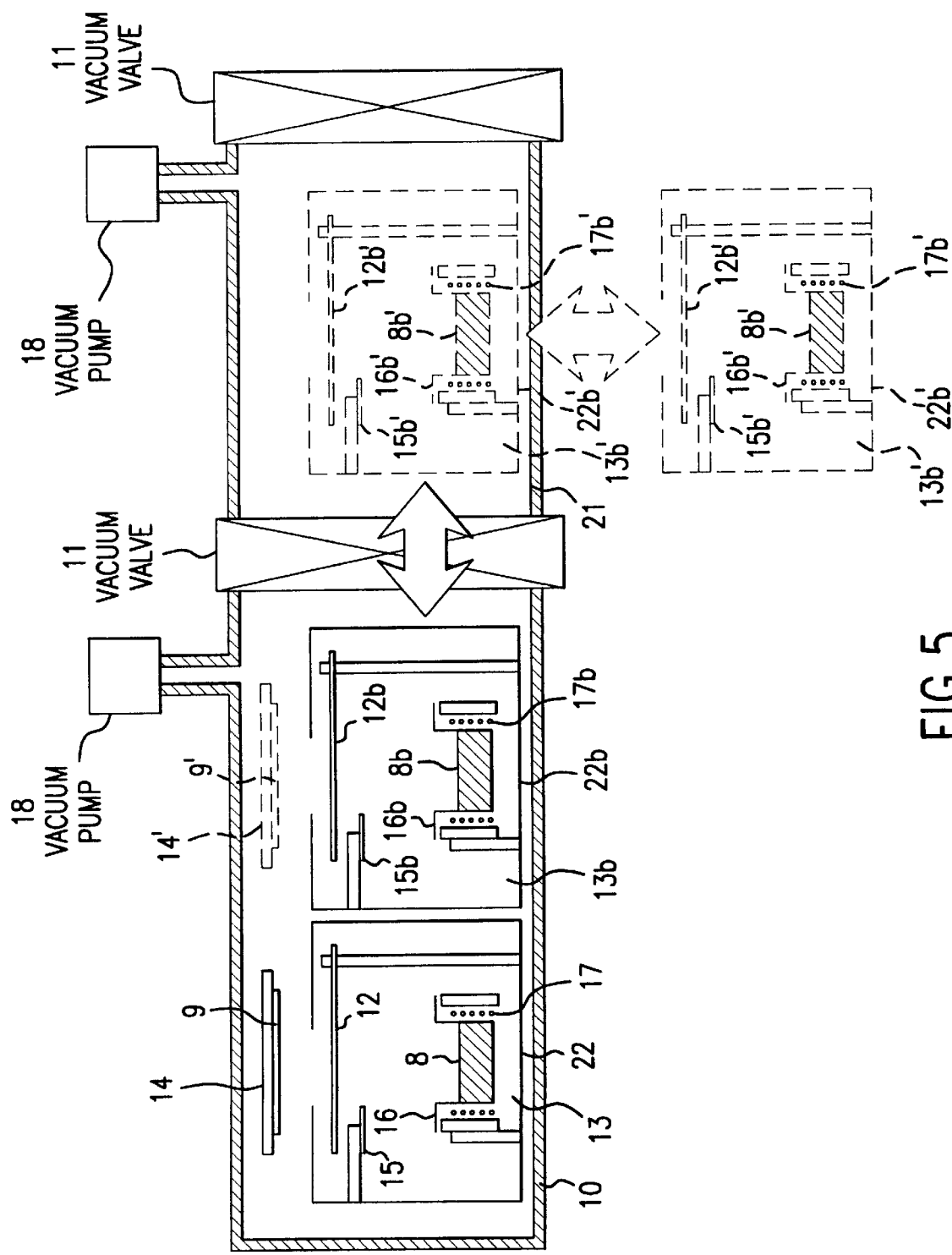
FIG. 5 is a cross sectional view of an apparatus for depositing one organic layer or one inorganic layer of the light-emitting element according to a fourth embodiment of the invention.

FIG. 5 is a cross sectional view of an apparatus for depositing one organic layer or one inorganic layer of the light-emitting element according to the fourth embodiment of the invention. The apparatus of FIG. 5 facilitates loading of two parts sets 13 and 13b in a vacuum chamber for layer deposition. A load lock and preheating chamber 21 for load locking and preheating is connected to a vacuum chamber 10 via a vacuum valve 11. The load lock and preheating chamber 21 is constructed such that the initialization of the source may be conducted therein. That is, in case the constituent parts set 13b' is loaded therein, the load lock and preheating chamber 21 is actuated so that the heater 17b' for heating the source 8b' may be operated, i.e. completing the wiring and piping for supplying power to the heater 17b'. On the other hand, the foregoing load lock chamber 19 of FIG. 3 is unable to initialize the source therein. That is, the load lock chamber 19 lacks the function of operating the heater 17b' for heating the source 8b' in the constituent parts set loaded therein.

The vacuum chamber 10 of FIG. 5 is provided with a space and means for simultaneously loading two constituent parts sets 13 and 13b therein.

In this structure, a plurality of parts sets is prepared. While a predetermined thin layer is deposited on a substrate 9 by using a parts set 13 in a vacuum chamber 10, another parts set 13b' with another source 8b' thereon is loaded in the load lock and preheating chamber 21 as indicated by the bidirectional arrow described by broken lines in FIG. 5; the load lock and preheating chamber 21 is evacuated; the source 8b' is initialized; the vacuum valve 11 is opened; the parts set 13b' is loaded in the vacuum chamber 10 as a parts set 13b as indicated by the bidirectional arrow described by solid lines in FIG. 5; and another substrate 9' is positioned above the parts set 13b. This preparation facilitates starting of the next layer deposition immediately. Thus, the time for cleaning the contaminated parts set 13, the time for evacuating the chamber 10, the time for initializing the source 8, the time for positioning the substrate 9, the time for taking out the used parts set 13 from the chamber 10, and the time for loading the cleaned parts set 13 to the chamber 10 are not required additionally. That is, all the steps of FIG. 10 except the steps of heating up the next source and depositing a next layer are substantially omitted from the process of FIG. 10. Therefore, the rate of operation of the apparatus for depositing a thin layer is remarkably increased.

In FIG. 5, the parts set 13b operates as a back up of the parts set 13. When a source material is exhausted, that is when it becomes impossible to use the source 8 any more during the layer deposition, the layer deposition may be resumed simply by switching from the source 8 to the source 8b and by heating the source 8b up to its operating temperature. Thus, it is not necessary to resume all the steps of FIG. 6 except the steps of heating up the source and depositing the next layer even when the source 8 is exhausted. Therefore, the rate of operation of the apparatus for depositing a thin film or layer is increased.

Figure 7:
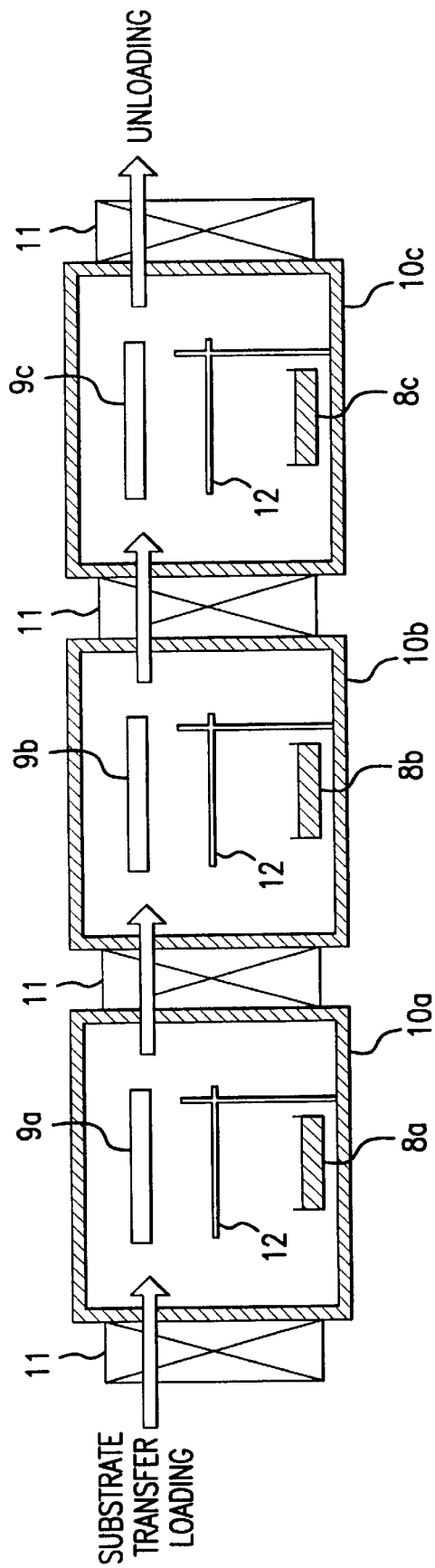
FIG. 7 is a cross sectional view of a conventional batch-type apparatus for depositing a thin layer.
Figure 8:
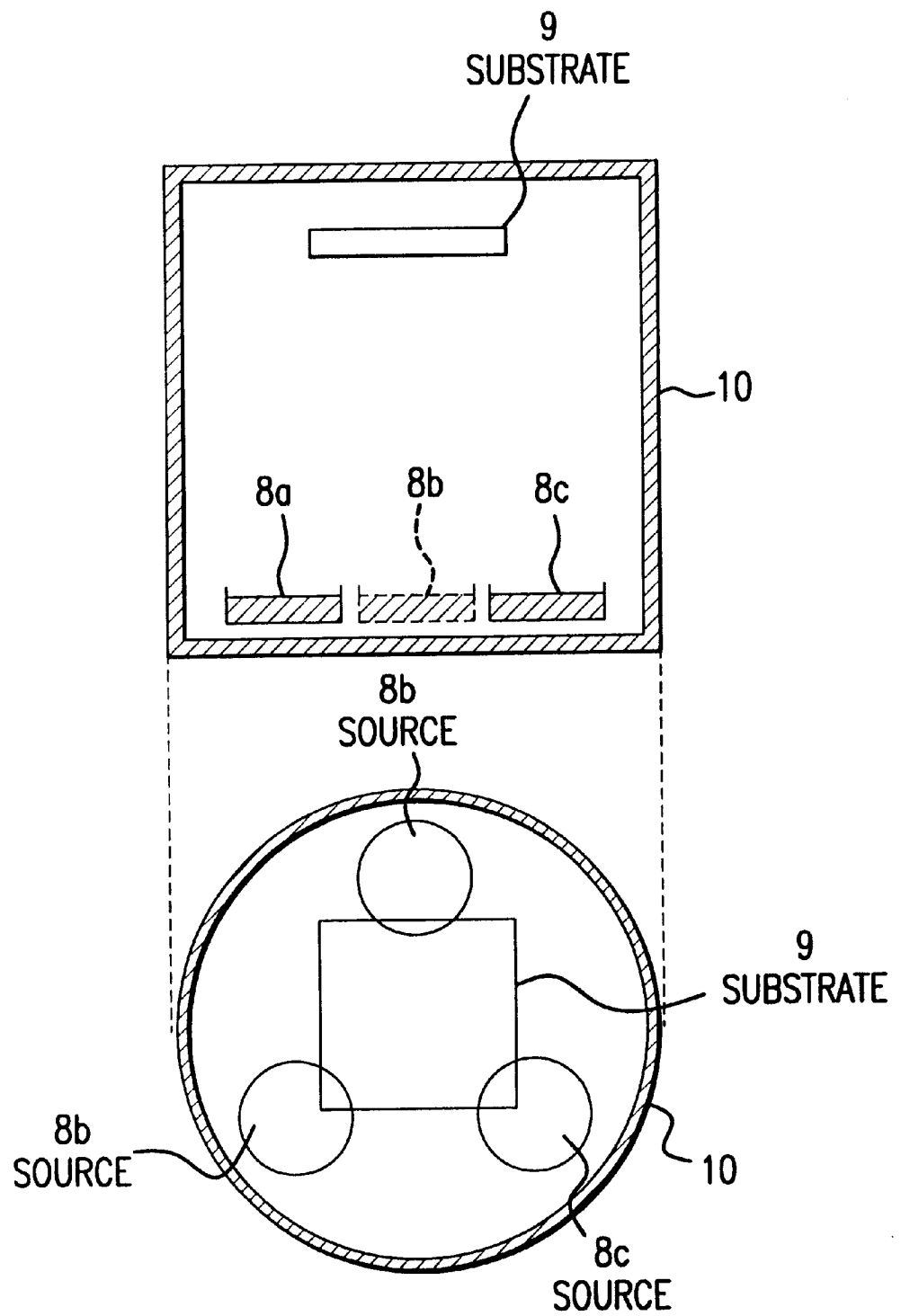
FIG. 8 shows cross sectional views of a conventional single-wafer-processing-type apparatus for depositing a thin layer.
Figure 9:
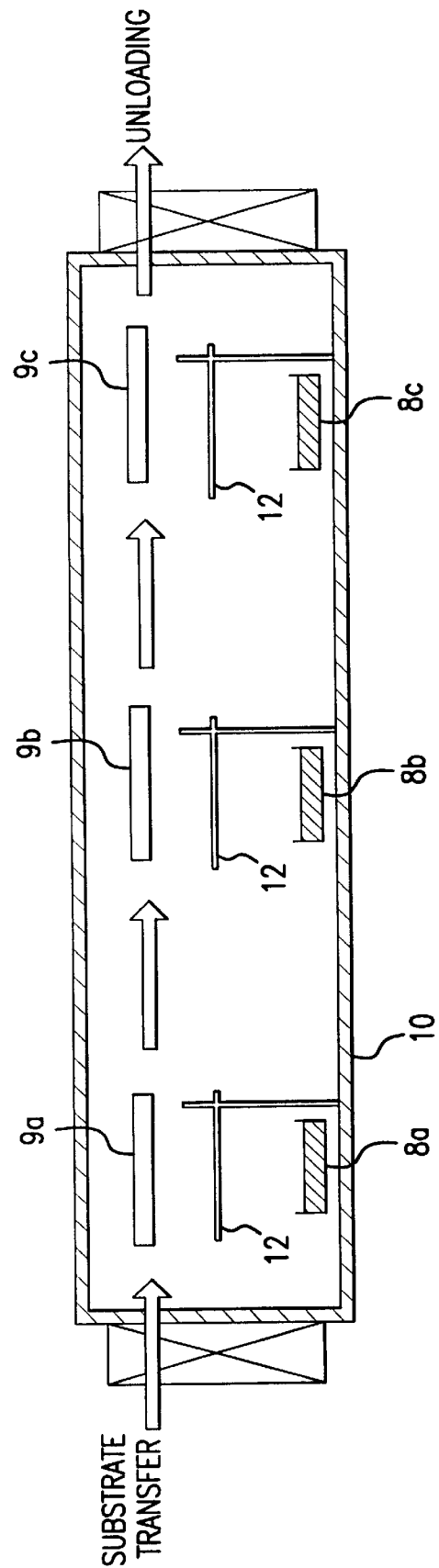
FIG. 9 is a cross sectional view of a conventional transfer-type apparatus for depositing a thin layer.

The present invention is applicable to the conventional apparatuses of FIGS. 7, 8 and 9, where each of the apparatuses includes a shielding cover, a source 8a, 8b or 8c, a mask, a shutter, a sensor and a substrate positioned in its vacuum chamber for layer deposition.

Now, the rates of operation of the apparatuses according to the invention and the prior art will be compared hereinafter by way of deposition of plural (N) constituent layers.

Prior Art

One batch process in the conventional vacuum deposition apparatus includes, as described in FIG. 10, the step of cleaning the constituent parts contaminated with dust, the step of loading the cleaned constituent parts into the vacuum chamber, the step of evacuating the vacuum chamber, the step of initializing the source, the step of heating the source, the step of depositing a constituent layer on a substrate, the step of changing of the substrates, and the step of removing the contaminated constituent parts. The time spent by each step of FIG. 10 is estimated as follows.

(1) The step of cleaning the contaminated constituent parts: 15 min.

Although it depends on the cleaning method, the time is estimated based on the wiping-off of the powdery dust with organic solvent or the ultrasonic cleaning.

(2) The step of removing the contaminated constituent parts and the step of loading the cleaned constituent parts into the vacuum chamber: 5 min., respectively.

(3) The step of evacuating the vacuum chamber: 60 min.

Estimated for evacuating the chamber to the vacuum condition of $10^{-6}$ Torr or smaller.

(4) The step of initializing the source: 5 min.

Inclusive of initialization works other than degassing.

(5) The step of heating the source: 5 min.

(6) The step of depositing a constituent layer: 5 min.

Estimated for the deposition of a layer of 900 Å in thickness at the deposition rate of 3 Å/s.

(7) The step of changing of the substrates: 1 min.

It is assumed that the contaminated constituent parts are cleaned after depositing M pieces of elements, each having N layers.

The total time of one batch process for depositing plural (N) constituent layers is the sum of the times of the above described steps (1) through (7) and is $\{90+(10N+1)M\}$ min. In this total time, the operating time of the apparatus is equivalent to the time for deposition, i.e. $\{5 \text{ NM}\}$ min. Therefore, the rate of operation of the apparatus is expressed by $\{5 \text{ NM}/(90+(10N+1)M\}\times100\%$. When $N=M=1$, the rate of operation of the apparatus is 5%.

Present Invention

Figure 6:
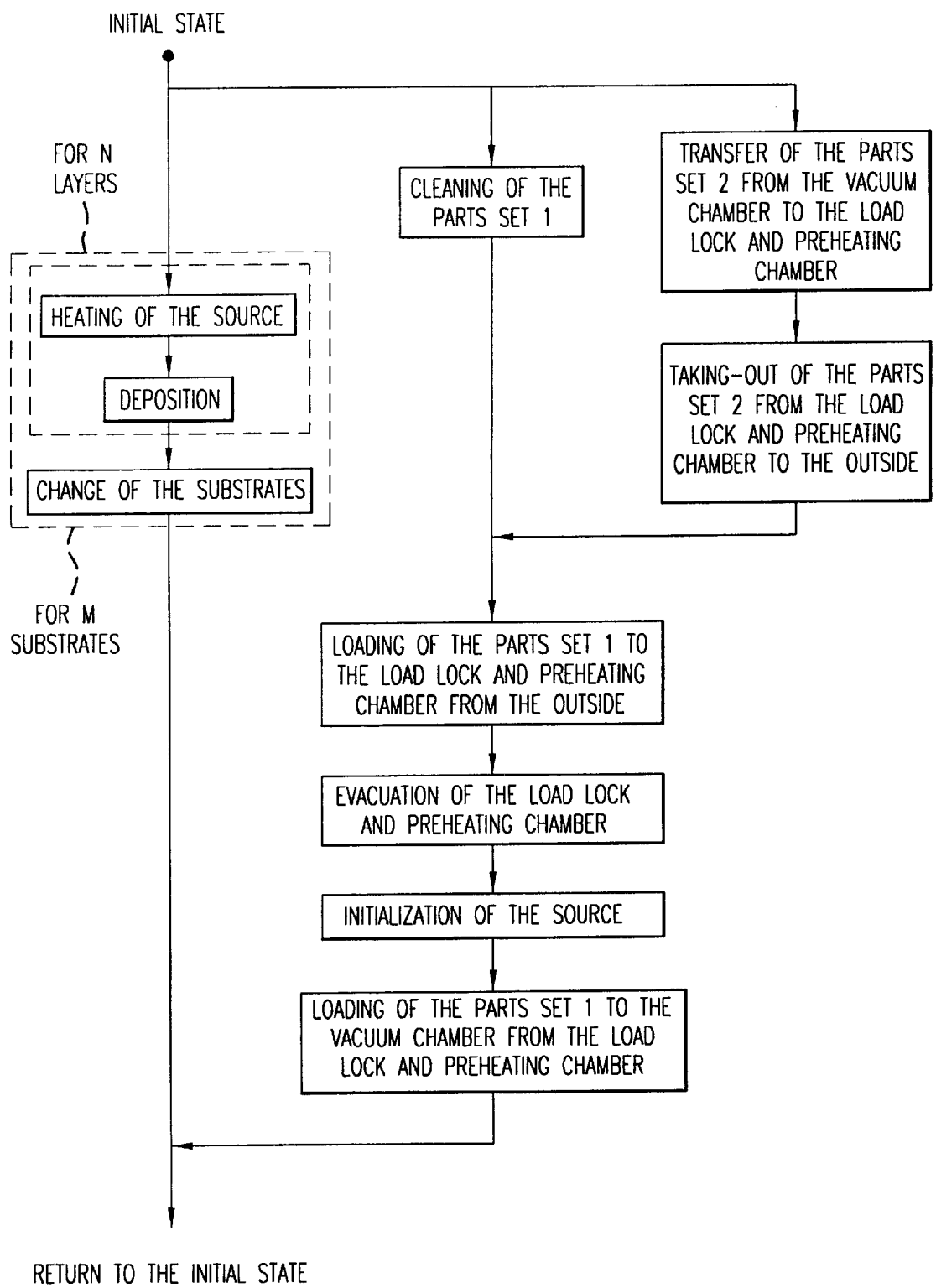
FIG. 6 is a flow chart describing one batch process in the vacuum deposition apparatuses according to the invention.

When the contaminated constituent parts are cleaned after the deposition of M pieces of elements, each consisting of plural (N) constituent layers, in a single-wafer-processing-type vacuum deposition apparatus, the flow chart of one batch process for forming the plural (N) constituent layers is described in FIG. 6. Comparing FIG. 6 with FIG. 10, the steps of taking out the contaminated parts set from the vacuum chamber to the outside and a series of steps from the step of cleaning the contaminated parts set to the step of loading the cleaned parts set into the vacuum chamber may be conducted simultaneously while the step of heating the source and the step of depositing a constituent layer are conducted in the vacuum chamber. The rate of operation of the apparatus according to the invention is calculated from the following formula based on the flow chart of FIG. 6.

(Time for deposition)/(Time for heating up the source+ Time for deposition+Time for changing of the substrates after forming N layers)=$\{5 \text{ NM}/(10N+1)M\}\times100\%=\{5N/(10N+1)\}\times100\%$ The calculated rate of operation of the apparatus according to the invention is approximately 50% regardless of the value of N, which is 10 times as high as the rate of operation of the conventional apparatus.

As explained above, the apparatus according to the invention facilitates deposition of the organic or imorganic layer which contains less defects with high rate of operation thereof.

What is claimed is:

1. A deposition apparatus for depositing a layer of an organic thin-film light-emitting element on a substrate, comprising:

a vacuum chamber for depositing a layer for constituting an organic thin-film light-emitting element on a substrate disposed therein;

a set of parts disposed in the vacuum chamber for depositing the layer on the substrate and including a source for the layer, a dust of a material disposed in the source and evaporated therefrom being adhered to the set of parts; and a supporting member for supporting the set of parts so that the set of parts is replaceably disposed in the chamber.

2. An apparatus according to claim 1, further comprising a vacuum valve connected to the vacuum chamber, and a load lock chamber having a vacuum pump, said load lock chamber being connected to the vacuum chamber through the vacuum valve to replace the set of parts while the vacuum chamber is maintained in a vacuum condition.

3. An apparatus according to claim 1, further comprising a preheating chamber for initializing said source, said preheating chamber including temperature regulating means for regulating temperature of said source and means for maintaining a vacuum condition of the preheating chamber, said preheating chamber being spaced apart from said vacuum chamber.

4. An apparatus according to claim 3, further comprising a vacuum valve for connecting the preheating chamber with the vacuum chamber to facilitate transfer of the source between the preheating chamber and the vacuum chamber while the vacuum chamber is maintained in the vacuum condition.

5. An apparatus according to claim 2, further comprising an additional set of parts supported by another support member and including another source, said load lock chamber functioning as a preheating chamber for initializing said another source.

6. An apparatus according to claim 1, wherein said set of parts comprises said source for the material of the layer, a heater for heating the source, a sensor for monitoring the thickness of the layer, a shutter for controlling a vapor flow of the material at a start and end of deposition of the layer, a mask for shaping the layer with a predetermined pattern, and a shielding cover for preventing the material from accumulating on an inside wall of the vacuum chamber except the substrate.

7. A deposition apparatus for an organic thin-film light-emitting element having at least one organic layer, comprising:

a vacuum chamber for depositing a layer on a substrate;

a source of a constituent material of said layer; and a preheating chamber for receiving the source to initialize the same, said preheating chamber including temperature regulating means for regulating a temperature of said source and means for maintaining a vacuum condition of said preheating chamber, said preheating chamber being spaced apart from said vacuum chamber.

8. An apparatus according to claim 7, further comprising a vacuum valve for connecting the preheating chamber with the vacuum chamber to facilitate transfer of the source between the preheating chamber and the vacuum chamber while the vacuum chamber is maintained in the vacuum condition.

* * * * *

UNITED STATES PATENT AND TRADEMARK OFFICE
CERTIFICATE OF CORRECTION

| | |
|---|---|
| PATENT NO. | : 6,179,923 B1 |
| DATED | : January 30, 2001 |
| INVENTOR(S) | : Tetsuya Yamamoto, Yotaro Shiraishi, Takao Maeda |

Page 1 of 2

It is certified that error appears in the above-identified patent and that said Letters Patent is hereby corrected as shown below:

Figure 6,
Change the position of a lead line for "FOR N LAYERS' as shown in red in the attached copy thereof.

Signed and Sealed this

Eighteenth Day of September, 2001

*Attest:*

*Attesting Officer*

NICHOLAS P. GODICI
*Acting Director of the United States Patent and Trademark Office*